(12) United States Patent
Risbo et al.

(10) Patent No.: US 7,809,346 B2
(45) Date of Patent: Oct. 5, 2010

(54) DIGITAL AUDIO RECEIVER WITH REDUCED AM INTERFERENCE

(75) Inventors: Lars Risbo, København Ø (DK); Luis E. Ossa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1518 days.

(21) Appl. No.: 11/118,831

(22) Filed: Apr. 29, 2005

(65) Prior Publication Data

US 2006/0247810 A1   Nov. 2, 2006

(51) Int. Cl.
*H04B 1/10* (2006.01)
(52) U.S. Cl. .................... 455/296; 455/63.1; 455/67.13
(58) Field of Classification Search ............... 455/63.1, 455/67.13, 296
See application file for complete search history.

(56) References Cited

U.S. PATENT DOCUMENTS

| | | | |
|---|---|---|---|
| 6,456,127 B1 | 9/2002 | Tsecouras | |
| 6,748,028 B1 | 6/2004 | Torre et al. | |
| 2002/0057115 A1 | 5/2002 | Tsecouras | |
| 2003/0058973 A1 | 3/2003 | Tsecouras | |
| 2005/0097154 A1* | 5/2005 | Tsecouras | .................. 708/300 |

* cited by examiner

*Primary Examiner*—Raymond S Dean
(74) *Attorney, Agent, or Firm*—John J. Patti; Wade J. Brady, III; Frederick J. Telecky, Jr.

(57) ABSTRACT

A digital audio system including a digital audio amplifier with reduced AM interference. The digital audio amplifier includes a pulse-width-modulation (PWM) processor in which a digital datastream is upsampled by an interpolation filter. A sample rate converter resamples the upsampled datastream to produce a datastream at a converted sampling frequency, or PWM frame rate. The converted datastream is then applied to pulse-width-modulation circuitry which generates a PWM signal at the PWM frame rate. The sample rate converter resamples according to a sample rate conversion ratio associated with the AM tuned frequency. For example, the sample rate conversion ratio can be selected so that the PWM frame rate and its lower harmonics avoid an AM tuned frequency, any intermediate frequency in the AM tuner, and also an image frequency in the tuner.

19 Claims, 7 Drawing Sheets

DIGITAL AUDIO RECEIVER WITH REDUCED AM INTERFERENCE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital audio systems, and is more specifically directed to digital audio systems utilizing class D output amplification.

In recent years, digital signal processing techniques have become prevalent in many electronic systems. Tremendous increases in the switching speed of digital circuits have enabled digital signal processing to replace, in large part, analog circuits in many applications. For example, the sampling rates of modern digital signal processing are sufficiently fast that digital techniques have become widely implemented in audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD and plasma televisions, and DVD receivers. The ability to realize the audio output amplifier in CMOS has also enabled integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

As is fundamental in the art, several types of audio signals are amplitude-modulated signals, in which a sinusoidal signal (the "carrier") at a relatively high frequency is amplitude-modulated with the audio information. Conventional tuners include an analog demodulator that mixes the input signal with an unmodulated sinusoid at the carrier frequency in one or more stages, to resolve a difference signal corresponding to the modulated audio information, but at baseband (i.e., audio) frequencies. These conventional tuners then convert the baseband modulation signal to a digital data stream by way of conventional analog-to-digital conversion, at a fixed sample frequency (e.g., 44.1 kHz, or 48 kHz) that is above the Nyquist criterion for the desired audio frequencies. In conventional class D audio systems, the sampled baseband modulation signal is then pulse-width-modulated to produce drive signals for the system speakers.

It has been observed, in connection with this invention, that the clock rates involved in the generation of pulse-width-modulated control signals for class D output amplifiers also produce significant electromagnetic interference (EMI). This EMI can be of sufficient magnitude to cause interference with the incoming AM signal, and also with the incoming signal after it has been partially demodulated to an intermediate frequency (IF) when conventional two-step demodulation is used. Specifically, it has been observed, in conventional digital audio systems, that lower harmonics of typical PWM frame rates are within the AM radio frequency band, and that the fundamental PWM frame rate frequency and its lower harmonics can interfere with the tuned AM carrier frequency, the IF, and other frequencies in the demodulation of the incoming AM signal. This interference can significantly degrade the signal-to-noise ratio, and reduce the sensitivity of the.

It has been previously recognized that it would be useful to select a PWM frame rate frequency, for switching amplifiers such as class D output amplifiers, that avoids certain frequencies. Conventional techniques for selecting the pulse frame rate of switching amplifiers are described in U.S. Pat. No. 6,456,127 B1, and in U.S. Patent Application Publications US 2002/0057115 A1 and US 2003/0058973 A1, all of which are commonly assigned herewith and incorporated hereinto by this reference.

These and other conventional approaches to adjusting the PWM frame rate and other high-speed clock rates to avoid AM interference are typically quite complicated. According to one type of such adjustment, the audio sample rate is adjusted according to the tuned AM frequency, with the downstream clock rates (including the PWM frame rate) being adjusted according to the adjusted sample rate. Conventional systems following this approach require significant digital filtering to eliminate artifacts caused by the sample rate adjustment, however. In addition, it has been observed that conventional techniques for selecting the appropriate adjusted sample rate or other clock rate adjustment are quite complicated, involving substantial investment in logic circuitry or computational complexity.

BRIEF SUMMARY OF THE INVENTION

It is therefore an object of this invention to provide a digital audio receiver in which the pulse-width-modulation (PWM) sampling frequency can be adjusted in response to with changes in the amplitude-modulated (AM) tuning frequency in a computationally efficient manner.

It is a further object of this invention to provide such a receiver in which the adjustment of the PWM sampling frequency does not require additional filters to remove audible noise.

It is a further object of this invention to provide such a receiver in which adjustment of the PWM sampling frequency is effected by a sample rate converter (SRC) that generates minimum audible noise.

It is a further object of this invention to provide such a receiver in which a lower sample rate AM input signal can be easily upconverted to a higher PWM sampling frequency.

It is a further object of this invention to provide such a receiver in which the upconversion of the signal sampling frequency can be efficiently effected without loss of dynamic range.

Other objects and advantages of this invention will be apparent to those of ordinary skill in the art having reference to the following specification together with its drawings.

The present invention may be implemented into a digital audio receiver by providing an interpolation filter that upsamples the incoming audio channel at a selected multiple based on the input sampling frequency. This datastream is then resampled at a second sampling frequency that corresponds to the input sampling frequency multiplied by a sample-rate-conversion ratio. In the AM demodulation context, the sample-rate-conversion ratio is selected so that the PWM frame rate and its lower harmonics avoid the AM carrier frequency (and also any intermediate frequencies in demodulation), and so that spurious audio band interference at the sample rate converter is avoided. Both PWM-AM interference and also audible interference from the sample-rate-conversion are thus avoided.

According to another aspect of the invention, the digital audio system includes precalculated PWM frame rate frequencies for expected AM tuning frequencies, in which the precalculated PWM frame rates are selected to avoid interference with the tuning frequency and any intermediate demodulating frequency. Because there typically exist multiple such PWM frame rates that avoid interference, selection among the possible PWM frame rates optimizes spurious audible interference caused by the sample rate conversion itself.

DETAILED DESCRIPTION OF THE INVENTION

The present invention will be described in connection with its preferred embodiment, namely as implemented into a digital audio receiver, specifically a digital audio receiver that receives amplitude modulated (AM) input signals such as provided by way of conventional AM radio audio signals and as conventional television signals. This description is provided because this invention is particularly beneficial when used in such a context. However, it is also contemplated that this invention may be used to advantage in other audio and signal processing applications. Accordingly, it is to be understood that the following description is provided by way of example only, and is not intended to limit the true scope of this invention as claimed.

Figure 1A:
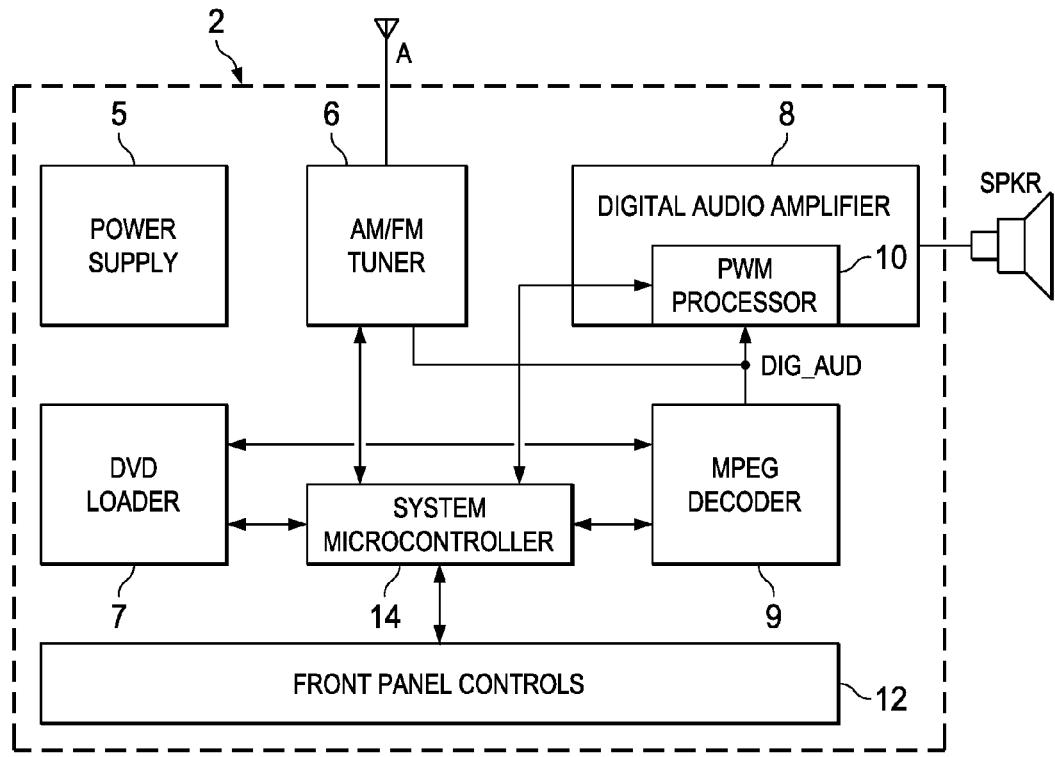
FIG. 1a is an electrical diagram, in block form, of a digital audio receiver constructed according to the preferred embodiments of the invention.

FIG. 1a illustrates, in block diagram form, an audio system including digital audio receiver 2, constructed according to the preferred embodiment of the invention. In this example, receiver 2 receives audio signals from multiple sources, including radio broadcasts via AM/FM tuner 6, DVD loader 7 and MPEG decoder 9. For purposes of this description, AM radio signals received by tuner 6 and audio DVD tracks from DVD loader 7 are in the form of amplitude modulation (AM) signals.

Figure 1B:
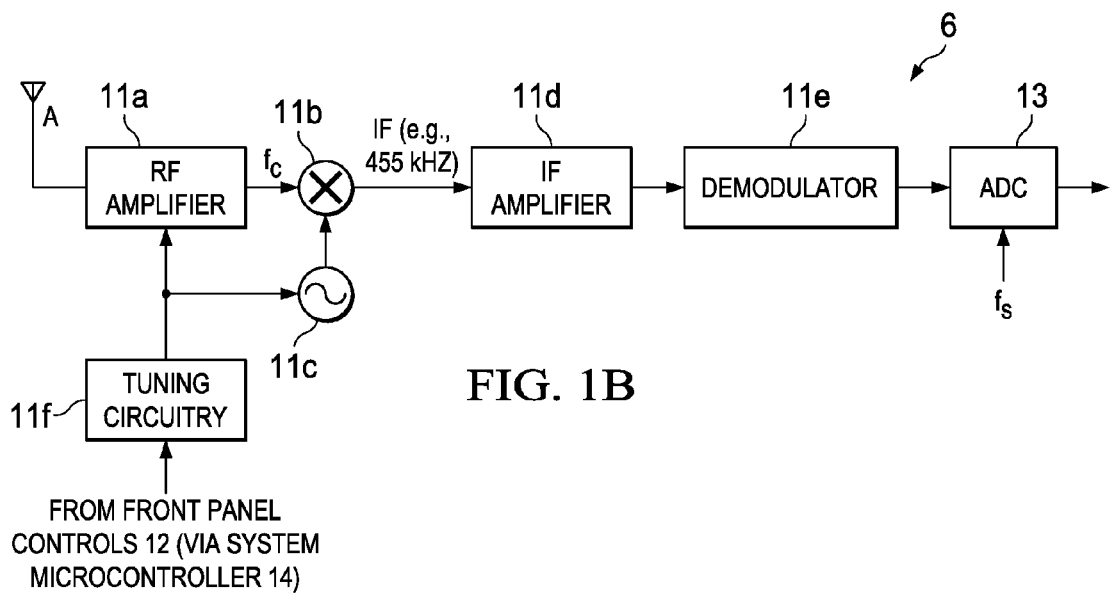
FIG. 1b is an electrical diagram, in block form, of an example of a tuner in the digital audio receiver of FIG. 1a, according to the preferred embodiments of the invention.

In the case of AM radio signals, AM/FM tuner 6 includes conventional tuner circuitry, coupled to antenna A, for receiving and demodulating broadcast radio signals at the desired carrier frequency. In this example, front panel controls 12 are provided, by way of which the user can select the desired radio station. The desired station frequency is read from front panel controls 12 by system microcontroller 14, which in turn communicates the desired frequency to AM/FM tuner 6. Conventional circuitry is provided within tuner 6 for recovering the signal at the desired frequency. For example, as shown in FIG. 1b, tuner 6 may be a conventional superheterodyne tuner circuit, including RF amplifier 11a, which amplifies the received signal at the desired AM tuned frequency $f_c$, which is the carrier frequency of the desired amplitude-modulates signal. The AM tuned frequency $f_c$ is selected by the listener via front panel controls 12, is communicated to system microcontroller 14. In turn, tuning circuitry 11f in tuner 6 controls amplifier 11a accordingly, and also controls the application of a periodic signal by local oscillator 11c to mixer 11b. The amplified modulated signal at the AM tuned frequency $f_c$, is also applied to mixer 11b, for downconverting of the modulated signal at AM tuned frequency $f_c$ to a desired intermediate frequency IF. Typically, intermediate frequency IF is a fixed frequency, such as 455 kHz for most AM radios or 262.5 kHz for automobile radios, regardless of the AM tuned frequency $f_c$. Tuning circuitry 11f thus controls local oscillator 11c to output a signal at a frequency that differs from carrier frequency $f_c$ by the intermediate frequency IF. The downconverted signal at intermediate frequency IF is then amplified by IF amplifier 11d, and demodulated to baseband by analog demodulator 11e. The resulting baseband signal from demodulator 11e is then converted to a digital datastream by analog-to-digital converter (ADC) 13 at a selected sampling frequency $f_s$, typical values of which are 44.1 kHz and 48 kHz.

Of course, other AM tuner architectures are known in the art, including both analog tuners of types other than the superheterodyne tuner shown in FIG. 1b, and also including digital tuners. These other architectures can alternatively be implemented into digital audio system 2 of FIG. 1a, according to the preferred embodiment of the invention.

Referring back to FIG. 1a, the digital datastream output from tuner 6 is forwarded to digital audio amplifier 8 over bus DIG_AUD. According to this embodiment of the invention, digital audio amplifier 8 includes digital audio pulse-width-modulation (PWM) processor 10, the construction of which will be described in further detail below. In summary, PWM processor 10 generates pulse-width-modulated (PWM) pulse trains that are used by drive circuitry (within digital audio amplifier 10, but not shown) to drive an output device, such as speaker SPKR, in class D fashion. And while only a single speaker SPKR is shown in FIG. 1a, it is contemplated that PWM processor 10 will have the capability of driving multiple audio channels, and thus multiple speakers SPKR as is well known in the art. In such multiple channel cases, tuner 6 will be providing multiple datastreams, each corresponding to one of these channels.

As known in the art, the conversion of pulse-code-modulated (PCM) signals to PWM output signals involves the conversion of the amplitude of each PCM sample to a duty cycle of a square wave of constant amplitude and constant frequency. The fundamental frequency of the output PWM square wave is commonly referred to as the PWM "frame rate". A high-speed clock is involved in the generation of the output PWM signal, with the resolution of the PWM signal corresponding to the relationship of the high-speed clock to the PWM frame rate. A typical high-speed PWM clock frequency is a multiple of 512 times that of the PWM frame rate (providing eight bits of resolution in the PCM-to-PWM conversion).

It has been observed that typical PWM frame rates can cause interference with the AM signal being demodulated and processed. For example, a PWM typical frame rate in digital audio of 384 kHz has a second harmonic of 768 kHz; this second harmonic is within the standard AM frequency band, and will interfere with the receipt of radio signals at and near 768 kHz. And as mentioned above, a common intermediate frequency in AM demodulation is 455 kHz; a PWM frame rate at or near 455 kHz will interfere with the intermediate demodulated signal at that IF. As will become apparent from the following description, the present invention is intended to reduce interference caused by the PWM frame rate clock signal.

In the exemplary receiver of FIG. 1a, as mentioned above, other audio sources are also available for processing by PWM processor 10. For example, DVD loader 7 and MPEG decoder 9 can operate in combination to provide digital audio signals from a DVD movie or the like; such digital audio streams are typically at a sampling frequency $f_s$ of 32 kHz in modern systems. Upconverting of this sampling frequency $f_s$ is also accomplished by PWM processor 10 according to this embodiment of the invention, as will be described in further detail below.

Figure 2:
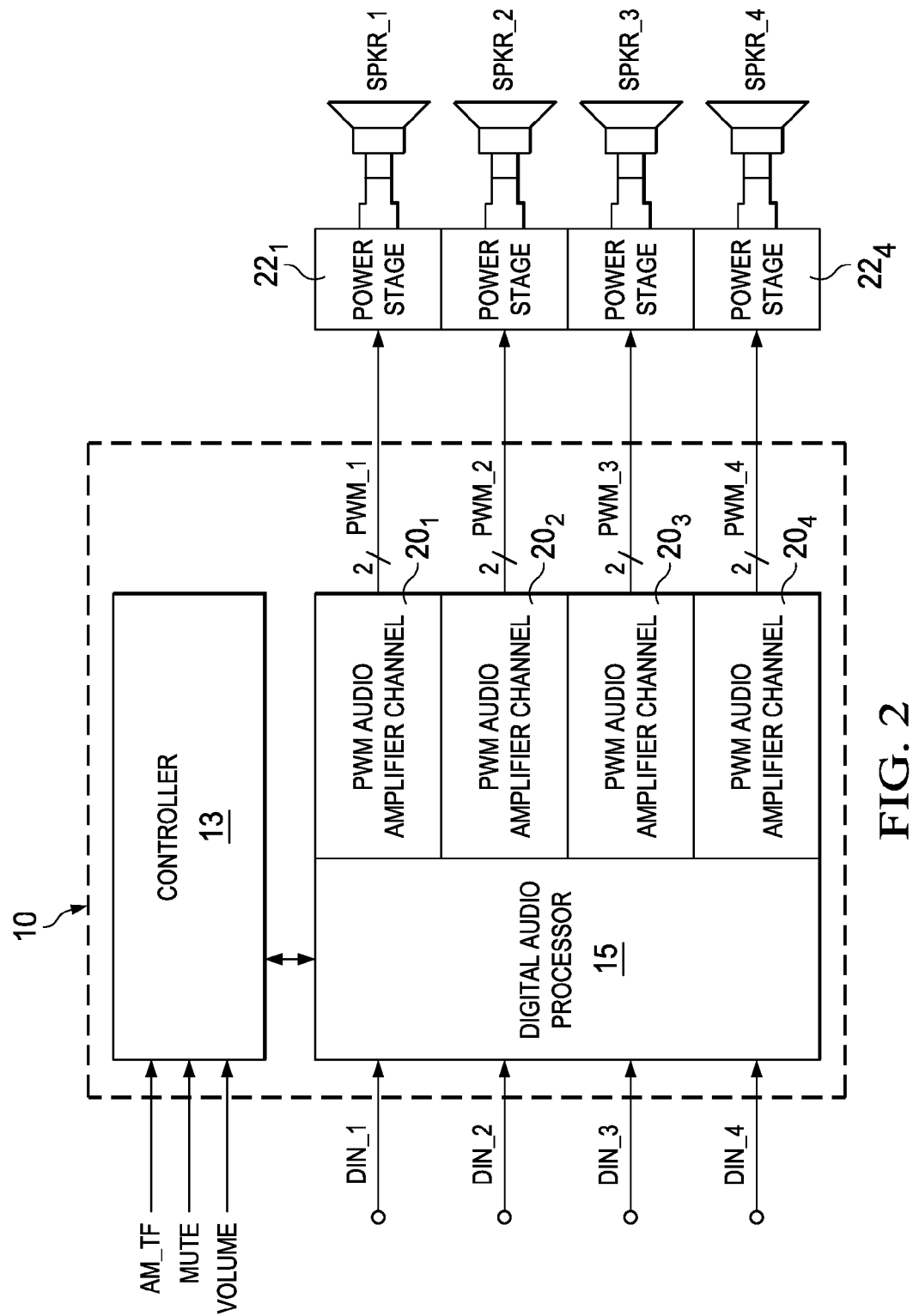
FIG. 2 is an electrical diagram, in block form, of a digital audio processor in the digital audio receiver of FIG. 1, constructed according to the preferred embodiments of the invention.

FIG. 2 illustrates, in further detail, the construction of PWM processor 10 according to the preferred embodiments of the invention. In this example, PWM processor 10 drives four output audio channels from four separate digital inputs from tuner 6 or elsewhere. It is, of course, contemplated that digital audio system 2 may drive more or fewer channels, depending upon the system requirements and specifications. According to this example, PWM processor 10 is preferably implemented as a single integrated circuit for performing much of the digital domain audio processing for the multiple audio channels. Processor 10 may, alternatively, be implemented by multiple integrated circuits, if appropriate for a particular application.

Within processor 10, digital audio processing function 15 has multiple inputs that are coupled to one or more audio sources, and that receives four input signals DIN_1 through DIN_4, in the form of digital datastreams at sampling frequency $f_s$. Digital audio processing function 15 includes conventional circuitry for performing the conventional functions of parametric speaker equalization or "voicing", implementation of graphic equalizer presets, treble and bass adjustment, precision soft volume control on the audio signal being processed for its channel. Other digital functions that can be performed by digital audio processing function 15 include loudness compensation to boost the bass frequencies when the output for the channel is low, dynamic range compression, background noise floor compensation or noise squelch, center or sub-woofer channel synthesis, programmable dither, peak limiting and clipping, and other digital filter processing. These functions are typically performed by the application of biquad, or second-order IIR, digital filters in a cascade arrangement.

Audio amplifier channels $20_1$ through $20_4$ drive class D pulse-width-modulated (PWM) output signals PWM_1 through PWM_4, respectively, according to the processed digital audio input signals for their respective channels, as processed by digital audio processor 16. These PWM output signals PWM_1 through PWM_4 are applied to power stage circuits $22_1$ through $22_4$, respectively, located elsewhere within digital audio amplifier 8 (FIG. 1a). Power stage circuits $22_1$ through $22_4$ in turn drive respective ones of speakers SPKR_1 through SPKR_4, either in a single-ended or a differential mode, by way of output signals PWM_1 through PWM_4.

Various control circuitry is also included within processor 10 according to this embodiment of the invention. Controller 13 provides the conventional control functions for processor 10, such functions, including overvoltage and undervoltage detection and protection, detection and control related to other faults in the operation of processor 10, the receipt and processing of mute signal MUTE, the receipt of user-programmable values for configuring and controlling processor 10, and, according to this invention, clock circuitry for generating the various clock signals used by processor 10. Also, according to this embodiment of the invention, digital audio processor 15 is controlled by clock and control signals from controller 13, and from other control functions within processor 10 (not shown).

Figure 3:
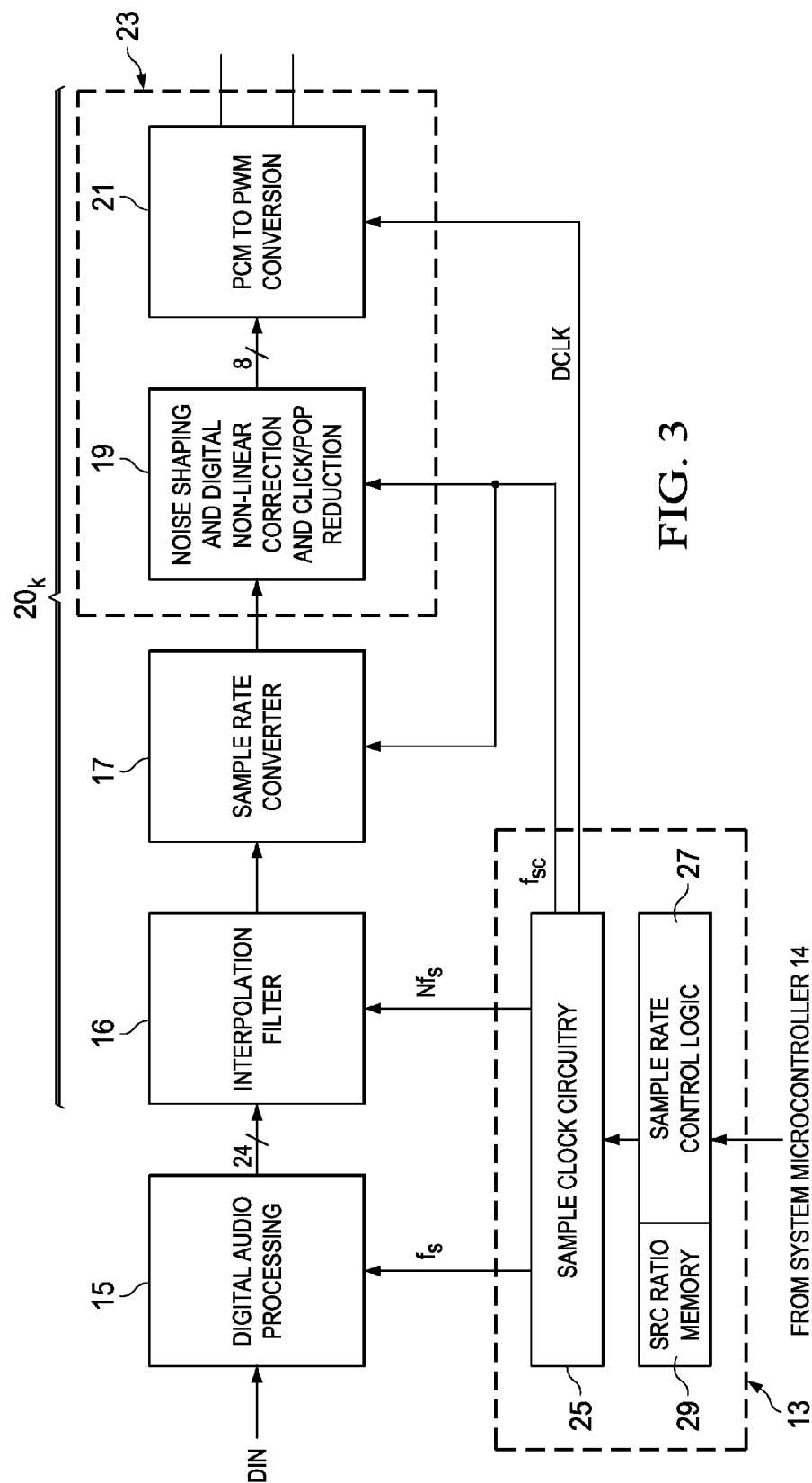
FIG. 3 is an electrical diagram, in block form, of an audio channel in the digital audio processor of FIG. 2, constructed according to the preferred embodiments of the invention.

Referring now to FIG. 3, the construction and operation of one of audio amplifier channels $20_k$, in combination with digital audio processing function 15, will now be described. As discussed above, digital audio processing function 15 applies the appropriate signal processing to the digital audio signal according to the functions of digital audio system 2. The output signal from digital audio processing function 15, in this example, is a pulse-code-modulated (PCM) signal, in which each sample of the data stream is expressed in a multiple-bit (e.g., 24-bit) data word of a value corresponding to the instantaneous amplitude of the signal at that sample time. Digital audio processing function 15 is clocked by a clock signal at sampling frequency $f_s$, as generated by sample clock circuitry 25 in controller 13.

According to this architecture, as is typically in conventional digital audio systems, the PCM input signal is converted to a pulse-width-modulated (PWM) signal to drive speaker SPKR for the corresponding channel $20_k$. In order to achieve high-fidelity sound output while utilizing a fully digital implementation of channel $20_k$, interpolation function 16 receives the PCM signal that is at sampling frequency $f_s$, and oversamples the processed PCM input signal to a sample rate that is a multiple N of this sampling frequency $f_s$. In this regard, a sampling clock signal at frequency $Nf_s$ is generated by sample clock circuitry 25, and clocks the datastream into interpolation filter 16. According to the preferred embodiment of the invention, the multiple N may remain fixed (e.g., at a multiple of eight); alternatively, according to other embodiments of the invention, this multiple N may be adjusted to provide additional degrees of freedom in selection of a PWM frame rate that minimizes electromagnetic interference and other noise effects, as will be described below. As known in the art, the oversampling applied by interpolation filter 16 may be effected by repeating each input value by the oversampling multiple N, at the higher frequency $Nf_s$. The output of interpolation filter 16 is thus an oversampled datastream, at a frequency corresponding to the multiple N times the input sampling frequency $f_s$.

According to this embodiment of the invention, sample rate converter 17 converts the sample rate of the interpolated signal at its input to a sample rate, corresponding to the eventual PWM frame rate, that generates reduced electromagnetic interference at the tuned AM frequency and any intermediate demodulation frequencies. The selection of a sample rate conversion ratio M, according to this invention, depends on the AM tuned frequency $f_c$, intermediate frequency IF, the desired PWM clock rate, and the bandwidth of the output audio signal, as will be described in further detail below. For purposes of FIG. 3, sample rate converter 17 receives the interpolated datastream at sampling frequency multiple $Nf_s$, and generates a datastream at the desired converted sampling frequency $f_{sc}$, based on a clock signal that is generated by sample clock circuitry 25 and sample rate control logic 27 in controller 13, with the selection of the desired converted sampling frequency $f_{sc}$ (and, optionally, the multiple N) made by sample rate control logic 27 in response to control signals from system microcontroller 14 (FIG. 1a). The selection of the desired converted sampling frequency $f_{sc}$ and its implementation by way of controller 13 will be described below.

In effect, sample rate converter 17 amounts to a zero-order hold of the incoming datastream from interpolation filter 16, followed by a resampling at converted sampling frequency $f_{sc}$. It has been discovered, according to this invention, that this resampling can be effected without requiring additional filtering to eliminate spurious noise from the audible band, by properly selecting the sample rate conversion ratio and thus the PWM frame rate.

The datastream at the converted sampling frequency $f_{sc}$ is then applied to pulse-width-modulator (PWM) 23. PWM 23, in this embodiment of the invention, includes multiple functions. As shown in the generalized illustration of FIG. 3, PWM 23 includes filtering sequence 19, which includes such conventional functions as noise shaping, digital non-linear correction, click and pop reduction, inter-channel delay processing, and the like. Examples of preferred implementations of filtering sequence 19 are described in copending applications Ser. No. 10/962,848 and Ser. No. 10/963,239, both filed Oct. 12, 2004, and copending application Ser. No. 10/988,268, filed Nov. 12, 2004, all commonly assigned herewith and incorporated herein by this reference.

PCM to PWM conversion function 21 then generates output pulse trains as PWM signals corresponding to the PCM output of filtering sequence 19. PCM to PWM conversion function 21 is preferably implemented by digital circuitry that digitally calculates the times at which rising and falling edges of the PWM output signals are to be issued. In this manner, the reference triangle waveform may simply be a high-speed clock signal. The digital circuitry can simply receive the input PCM signal on line PCM_in, and digitally calculate the edges of the differential PWM pulses, including the desired filtering. Conventional high-speed digital signal processing circuitry is capable of carrying out these calculations sufficiently rapidly for driving digital audio output PWM signals, as known in the art. Examples of PCM to PWM conversion function 21 suitable for use in connection with the preferred embodiments of this invention are also described in the above-incorporated applications Ser. No. 10/962,848, Ser. No. 10/963,239, and Ser. No. 10/988,268.

Filtering sequence 19 operates according to the converted sampling frequency $f_{sc}$, while PCM to PWM conversion function 21 receives high-speed clock DCLK from sample clock circuitry 25, by way of which the duty cycle of the output PWM signal is adjusted according to the amplitude of the PCM input signal. High-speed clock DCLK is typically at a much higher frequency than the sampling frequencies $f_{sc}$; for example at a multiple of 512 to provide nine bits of resolution. The resulting PWM pulses, at a PWM frame rate equal to the converted sampling frequency $f_{sc}$, are then forwarded on to the corresponding drive stage $22_k$ (FIG. 2) for channel $20_k$.

Figure 4:
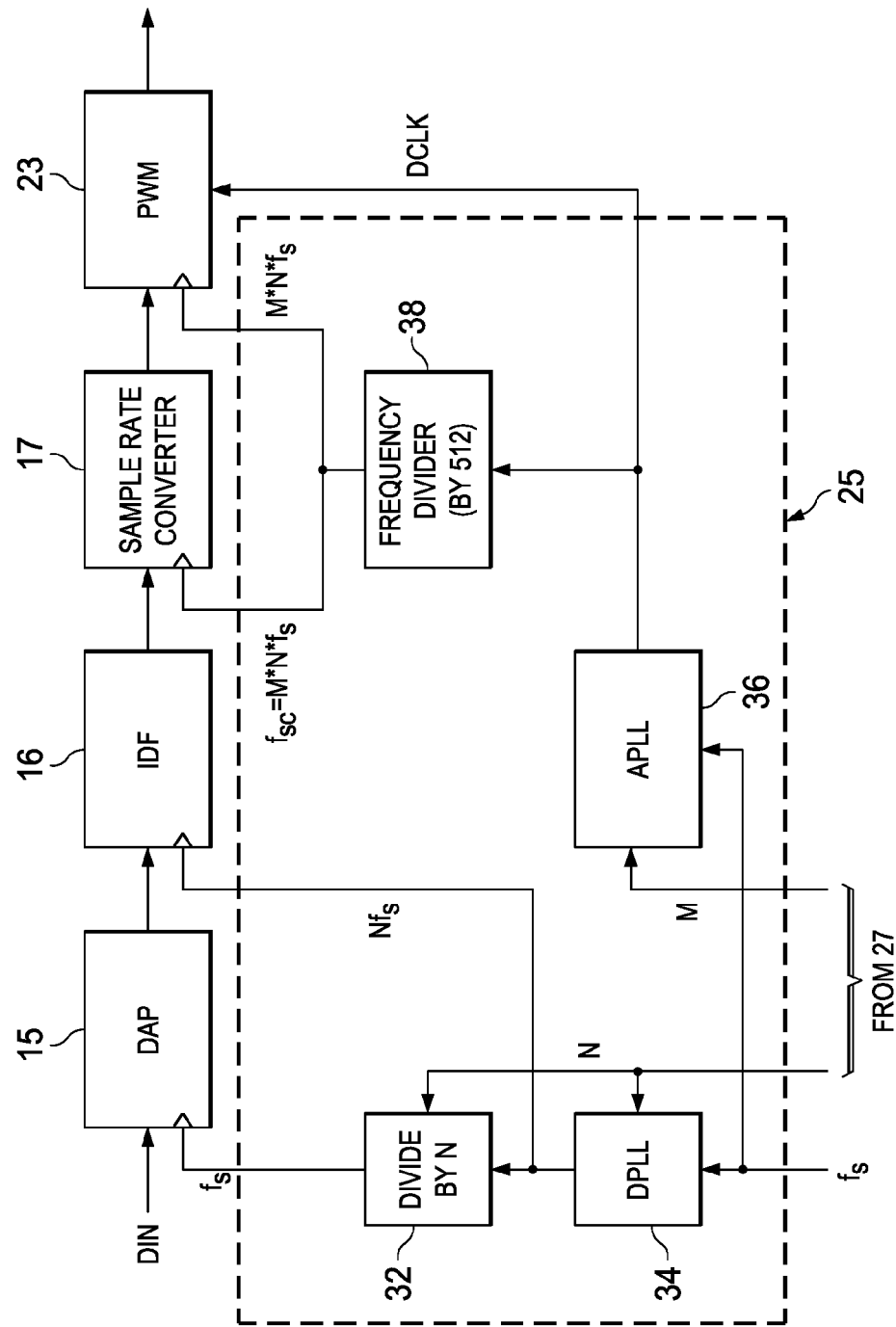
FIG. 4 is an electrical diagram, in block form, of functions in the audio channel in the digital audio processor of FIG. 3, shown in combination with clock circuitry for adjusting the various sampling frequencies therein.

Referring now to FIG. 4, the construction of sample clock circuitry 13, and its functional operation in connection with digital audio processor 15, interpolation filter 16, sample rate converter 17, and PCM to PWM conversion function 21, according to the preferred embodiment of the invention will now be described. As previously described relative to FIG. 3, sample clock circuitry 13 provides a clock signal at sampling frequency $f_s$ to digital audio processor 15, and a clock signal at sampling frequency multiple $Nf_s$ to interpolation filter 16. In addition, sample clock circuitry 13 provides high speed clock DCLK to PCM to PWM conversion function 21, and a clock signal at the desired converted sampling frequency $f_{sc}$ to sample rate converter 17 and to PCM to PWM conversion function 21.

According to this preferred embodiment of the invention, sample clock circuitry 13 includes digital phase-locked loop (DPLL) 34, which receives a reference clock signal, for example at sampling frequency $f_s$, and which in turn generates a clock signal at sampling clock multiple frequency $Nf_s$ accordingly. DPLL 34 may receive a control signal from sample rate control logic 27 with the desired multiple N; alternatively, the multiple N may be fixed at the desired interpolation multiple, for example N=8. The clock signal at sampling clock multiple frequency $Nf_s$ is applied to frequency divider 32, which in turn generates the sampling clock at sampling frequency $f_s$, and applies that sampling clock to digital audio processor 15. The clock signal at sampling clock multiple frequency $Nf_s$ is applied to interpolation filter 16.

In this example, the PCM signal on line DIN is input to digital audio processor 15, and processed according to the desired approach, in a synchronous manner at sampling frequency $f_s$, as described above. The output processed datastream from digital audio processor 15, which is also at sampling frequency $f_s$ is applied to interpolation filter 16, which oversamples this datastream at the multiple N to generate an oversampled datastream at sampling clock multiple frequency $Nf_s$ that is applied to sample rate converter 17, and there converted to converted sample frequency $f_{sc}$.

Sample clock circuitry 13 also includes analog PLL 36, which is a conventional analog phase-locked loop that generates high speed clock DCLK from the reference clock signal (e.g., at sampling frequency $f_s$), and in response to a sample rate conversion ratio M provided by sample rate control logic 27. According to this embodiment of the invention, APLL 36 generates high speed clock DCLK and applies it to PCM to PWM conversion function 21, and to frequency divider 38. As is fundamentally well-known in the art, analog PLLs such as APLL 36 are readily controllable to generate clock signals at desired multiples, by controlling input and feedback frequency dividers within the PLL. As such, ratio M from sample rate control logic 27 is preferably applied to either an input or feedback frequency divider in APLL 36, to control the frequency of the output signal from APLL 36 in the conventional manner.

Frequency divider 38 divides down the frequency of high speed clock DCLK, preferably by a fixed value (e.g., 512), and generates clock signals at converted sample rate frequency $f_{sc}$ that are applied to sample rate converter 17 and to PCM to PWM conversion function 21. Sample rate converter 17 converts the data stream from interpolation filter 16, at sampling clock multiple frequency $Nf_s$, to a datastream at converted sample rate frequency $f_{sc}$. Converted sample rate frequency $f_{sc}$ also serves as the PWM frame rate, in this embodiment of the invention, according to which PCM to PWM conversion function 21 converts the PCM datastream from sample rate converter 17 to the appropriate PWM control signals, as described above.

In this exemplary implementation, the high speed clock signal DCLK is at a frequency $f_{DCLK}$ that depends upon the sampling frequency $f_s$, the multiple N, and the sample rate conversion ratio M, as follows:

$$f_{DCLK} = R*f_{sc} = R*(M*N*f_s)$$

where R is the multiple of the high-speed clock signal relative to the converted sample rate frequency $f_{sc}$. For example, as noted above, resolution multiple R is preferably fixed to a relatively high multiple, such as R=512, to provide good resolution in the audio output.

Figure 5A:
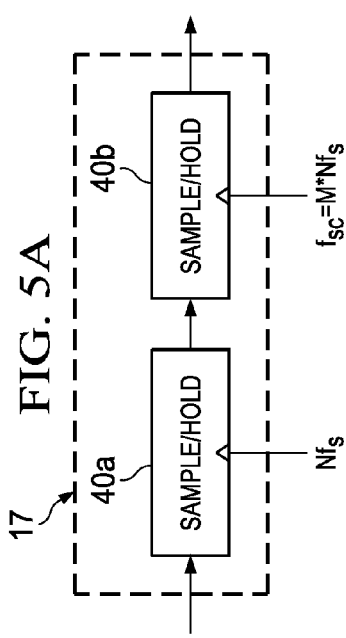
FIG. 5a is an electrical diagram, in block form, illustrating the construction of a sample rate converter in the audio channel of the digital audio processor according to the preferred embodiment of the invention.

FIG. 5a illustrates the construction of sample rate converter 17 according to the preferred embodiment of the invention. It has been discovered, according to this invention, that proper selection of the particular ratio M enables this simple construction, without requiring digital filtering or other complex processing in order to avoid audible noise. The selection of ratio M in this regard will be described in further detail below. As shown in FIG. 5a, sample rate converter 17 includes a first sample and hold circuit 40a, which is clocked at sampling rate multiple frequency $Nf_s$, and is simply a zero-order hold circuit. The output of sample and hold circuit 40a is then again merely resampled, by sample and hold circuit 40b, but at a clock rate corresponding to converted sample rate frequency $f_{sc}$.

According to a preferred embodiment of the invention, the converted sampling rate frequency $f_{SC}$, which equals (and will be, for purposes of this description, synonymous with) the PWM frame rate, is selected according to the AM tuned frequency $f_c$. In this embodiment of the invention, the selection of the PWM frame rate is effected by selecting an appropriate sample rate conversion ratio M to be applied by sample rate converter 17, with the selection of ratio M being made in response to the AM tuned frequency $f_c$. An additional degree of freedom in the adjustment of the PWM frame rate can be obtained by also adjusting the value of multiple N, although it is contemplated that a fixed oversampling multiple N will generally be sufficient.

It has been observed that the PWM frame rate can cause interference with AM demodulation and reception if it and its lower harmonics are near the AM tuned frequency $f_c$ itself, near the intermediate frequency IF, or near an image of the intermediate frequency IF (i.e., the tuned frequency plus twice the IF). According to the preferred embodiment of the invention, as evident from FIG. 4, the PWM frame rate $f_{sc}$ is selected from a set of discrete candidate frequencies, corresponding to a range of conversion ratios M. For example, consider a sampling frequency of 44.1 kHz, and a fixed multiple N=8. According to the preferred embodiment of the invention, a set of PWM frame rate frequencies $f_{sc}$ and corresponding DCLK rates $f_{DCLK}$ are:

|  | M = 5/8 | M = 6/8 | M = 7/8 | M = 8/8 | M = 9/8 | M = 12/8 |
| --- | --- | --- | --- | --- | --- | --- |
| $f_{SC}$ | 221 kHz | 265 kHz | 309 kHz | 353 kHz | 397 kHz | 529 kHz |
| $f_{DCLK}$ | 113 MHz | 136 MHz | 158 MHz | 181 MHz | 203 MHz | 271 MHz |

According to the preferred embodiment of the invention, the particular sample rate conversion ratio M is selected from among a set of candidate values, according to particular tests that will now be described relative to FIG. 6.

Figure 6:
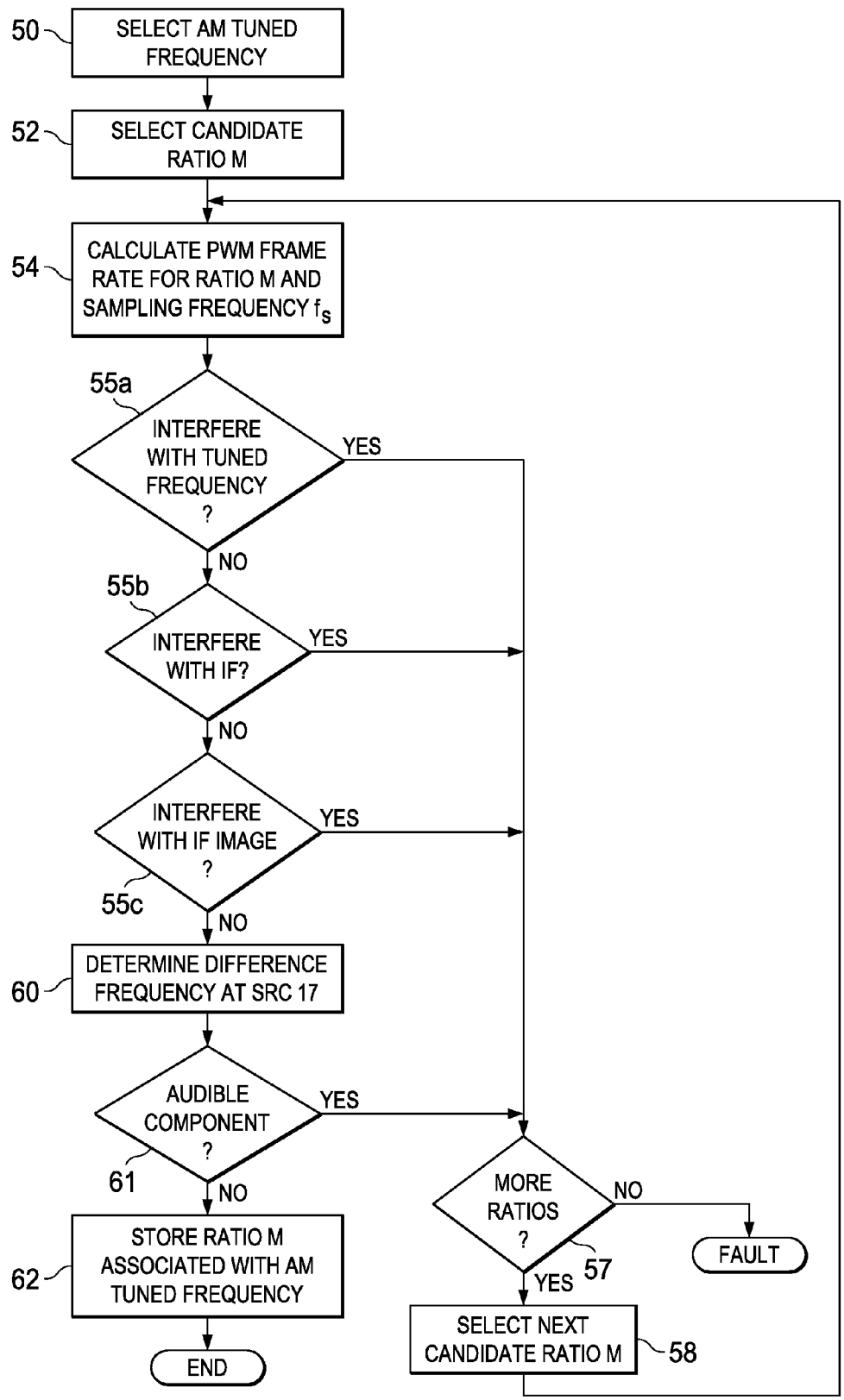
FIG. 6 is a flow diagram illustrating the operation of a process of associating sample rate conversion ratios with AM tuned frequencies, in the digital audio receiver according to the preferred embodiments of the invention.

The process of FIG. 6, according to this embodiment of the invention, associates a sample rate conversion ratio M with each discrete AM tuned frequency $f_c$. Accordingly, the process of FIG. 6 may be performed in real time upon the selection of an AM tuned frequency $f_c$ during the operation of the audio system. Alternatively, and indeed preferably, the process of FIG. 6 is performed prior to the manufacture and use of digital audio system 2 to associate each possible AM tuned frequency $f_c$ with a sample rate conversion ratio M and to store those associations in memory; in this case, sample rate control logic 27 can operate in response to a given AM tuned frequency $f_c$ by retrieving the appropriate ratio M and applying that ratio to sample clock circuitry 25. For example, one or more "profiles" may be stored in memory, for example in controller 13 (e.g., SRC ratio memory 29 of FIG. 3) or in system microcontroller 14, each profile including a set of associations of sample rate conversion ratio values M for each of the possible AM tuned frequencies. The user (or system manufacturer) can then select from among the profiles, depending upon the performance desired. Furthermore, in the case where digital audio system 2 can operate according to various sampling frequencies $f_s$ (e.g., 32 kHz, 44.1 kHz, and 48 kHz), multiple profiles (or sets of profiles) may also be characterized and stored to accommodate the different sampling frequencies.

It is therefore contemplated that the process of FIG. 6, in which the PWM frame rate and associated frequencies are selected and associated with specific AM tuned frequencies, may be performed by system microcontroller 14 within the digital audio system; alternatively, if the selection and association of PWM frame rate is being performed prior to manufacture of digital audio system 2, such as in a characterization operation, this process may be executed by a conventional computer workstation or the like.

In either case, this association process begins with process 50, in which a specific AM tuned frequency $f_c$ is selected. As mentioned above, according to the preferred embodiment of the invention, a set of several discrete sample rate conversion ratios are preferably defined in advance. An example of such a set of ratios are those illustrated in the above table (e.g., 5/8, 6/8, ..., 12/8). Accordingly, in process 52, a first one of these ratios is selected as a candidate sample rate conversion ratio. In process 54, the PWM frame rate, which in this case is the converted sample rate frequency $f_{SC}$, is calculated for this selected ratio M, using the current sampling frequency $f_s$ and the interpolation multiple N. In the exemplary embodiment described above, this calculation amounts to:

$$f_{sc} = M*N*f_s$$

Once the PWM frame rate $f_{sc}$ is calculated in process 54, this frequency can be tested to determine whether it would cause undesirable interference with the AM signal, both as received and as demodulated. According to this embodiment of the invention, this testing of the PWM frame rate $f_{sc}$ involves three separate tests: (i) whether the PWM frame rate or its first k harmonics (where k is typically 5 or 6) interfere with the AM tuned frequency $f_c$; (ii) whether the fundamental PWM frame rate or any of its lower harmonics interfere with the intermediate frequency IF generated in AM demodulation; and (iii) whether the fundamental PWM frame rate or its lower harmonics interfere with an image frequency corresponding to the difference between the AM tuned frequency $f_c$ and the second harmonic of the IF. Of course, other interference tests may also be performed, as appropriate for the particular digital audio system; conversely, one or more of these tests may be omitted if unnecessary to ensure the required fidelity for the particular system.

According to this embodiment of the invention, decision 55a determines whether the calculated PWM frame rate $f_{sc}$ would cause interference with the AM tuned frequency selected in process 50. Preferably, decision 55a is performed by comparing the calculated PWM frame rate $f_{sc}$, and also its second harmonic ($2f_{sc}$) with the AM tuned frequency. If the calculated PWM frame rate $f_{sc}$, and its second harmonic, differ from the AM tuned frequency $f_c$ by greater than an "interference bandwidth" value, this test criterion is met. The interference bandwidth is a frequency difference that has been observed, or is believed, to be a sufficient difference so that interference does not result. It is contemplated that different harmonics of the PWM frame rate $f_{sc}$ may have different interference bandwidth values associated therewith, because of the spreading of energy at those harmonics, and also because the AM tuner is sensitive in a bandwidth around the center, AM tuned, frequency. An example of a set of interference bandwidths, varying with the harmonics of the PWM frame rate, is:

| Harmonic of PWM frame rate $f_{sc}$ | Interference bandwidth (kHz) |
| --- | --- |
| Fundamental | 17.5 |
| $2^{nd}$ harmonic | 17.5 |
| $3^{rd}$ harmonic | 17.5 |
| $4^{th}$ harmonic | 20.0 |
| $5^{th}$ harmonic | 22.5 |
| $6^{th}$ harmonic | 23.5 |

According to this example, therefore, decision 55a will determine whether both the calculated PWM frame rate $f_{sc}$, and the calculated frame rate second harmonic $2f_{sc}$, differ from the AM tuned frequency $f_c$ by more than 17.5 kHz. If not (for either the fundamental or the $2^{nd}$ harmonic), decision 55a returns a NO result, and control passes to decision 57, as will be described below. If the calculated PWM frame rate $f_{sc}$, and the calculated frame rate second harmonic $2f_{sc}$ both differ from the AM tuned frequency $f_c$ by more than 17.5 kHz (decision 55a is YES), control passes to the next test, shown as decision 55b in FIG. 6.

Decision 55b determines whether any of the calculated PWM frame rate fundamental frequency $f_{sc}$ and its lower harmonics will interfere with the intermediate frequency IF in tuner 6 (FIG. 1b). Again, the interference bandwidth values determine whether such interference will be caused by these calculated frame rate harmonics. According to an exemplary implementation of the preferred embodiment of the invention, the fundamental of the calculated PWM frame rate $f_{sc}$ and its second through sixth harmonics are compared against the intermediate frequency IF to determine whether any of these frequencies are within the interference bandwidth of intermediate frequency IF. If any of these harmonics is within its interference bandwidth, decision 55b returns a NO result and control passes to decision 57. If none of these harmonics are within their interference bandwidth of intermediate frequency IF, decision 55b returns a YES result and the next test is evaluated, as shown by decision 55c of FIG. 6.

Decision 55c determines whether any of the calculated PWM frame rate fundamental frequency $f_{sc}$ and certain of its lower harmonics will interfere with an image frequency that is generated in tuner 6. This image frequency ImF is the difference between the second harmonic of the AM tuned frequency $f_c$ and the intermediate frequency IF; interference at this image frequency ImF has been observed to reduce the sensitivity of the AM tuner, as known in the art. According to an exemplary implementation of the preferred embodiment of the invention, the fundamental and second through sixth harmonics of PWM frame rate $f_{sc}$ are analyzed to determine whether any are within the interference bandwidth of this image frequency ImF. If so, decision 55c returns a NO result and control passes to decision 57.

As mentioned above, a NO result from any of decisions 55 indicates that the currently selected candidate sample rate conversion ratio M cannot be used, because of the interference that the corresponding PWM frame rate $f_{sc}$ would cause at tuner 6. Decision 57 then determines whether more candidate ratios M are yet to be analyzed for interference; if so (decision 57 is YES), the next candidate ratio M is selected in process 58, and the new PWM frame rate $f_{sc}$ is calculated in process 54 and tested in decisions 55. If all of the candidate ratios M have been analyzed (decision 57 is NO), then no sample rate conversion ratio M is available that does not cause AM tuning interference. This results in a FAULT condition; if occurring prior to manufacture, additional ratios may need to be considered, or perhaps the oversampling multiple N may be adjusted to provide an additional degree of freedom. If the process of FIG. 6 is being performed during actual system operation, a default setting may simply be selected, with the resulting interference simply tolerated.

On the other hand, if none of the fundamental and second through sixth harmonics of PWM frame rate $f_{sc}$ are within the interference bandwidth of this image frequency ImF, decision 55c returns a YES result, and the currently selected candidate sample rate conversion ratio M is a possible setting for digital audio system 2 at this AM tuned frequency $f_c$. Of course, other candidate sample rate conversion ratio values may also be suitable, from an AM interference standpoint. The existence of another candidate ratio M provides an additional degree of freedom, in that the selection may be optimized according to a secondary criteria (i.e., other than AM interference). According to this preferred embodiment of the invention, therefore, additional testing is then performed to determine whether sample rate converter 17 itself will generate audible noise.

Figure 7:
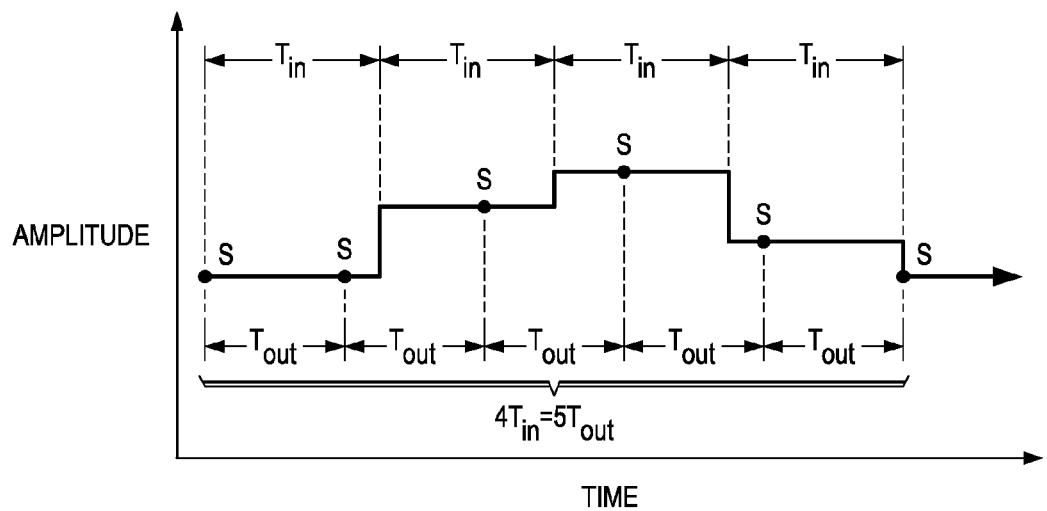
FIG. 7 is a timing diagram illustrating the operation of the sample rate converter according to the preferred embodiment of the invention.

FIG. 7 illustrates the cause of this possible audible noise at sample rate converter 17, for a simplified case in which interpolation filter 16 generates four interpolated samples of the input amplitude, and in which sample rate converter 17 resamples this sample stream at a frequency $f_{sc}$ that is five times the input sample frequency (and therefore 5/4 times the frequency of the output of interpolation filter 16). In this case, four periods $T_{in}$ of the interpolation filter 16 output ($4f_s$) equal, in time, five periods $T_{out}$ of converted sample frequency (PWM frame rate) $f_{sc}$. FIG. 7 illustrates sample points S indicating the resampling by sample rate converter at the higher frequency. In this example, therefore, with reference to FIG. 5, sample and hold circuit 40b samples one of the interpolated amplitude values twice, in each periodic pattern. This re-sampling is reflected, in a frequency domain representation of the output of sample rate converter 17, by a spike at a frequency related to the difference between the two frequencies at the input and output of sample rate converter 17.

In process 60, the calculated PWM frame rate $f_{sc}$ is compared against the sampling frequency $f_s$ to determine a difference frequency and its harmonics. In decision 61, these difference frequencies (fundamental and harmonics) are compared against the upper frequency of the audio bandwidth desired from digital audio system 2. Stated in the form of an equation, using calculated PWM frame rate $f_{sc}$ and sampling frequency $f_s$, and the upper audio frequency $f_{audio}$, process 60 and decision 61 evaluate:

$$f = \pm n \cdot (f_{sc} - f_s) \pm f_{audio}$$
$$= \pm nNMf_{sc} \pm f_{audio} \pm kNf_s$$

for reasonable integer values of n and k. If any component of this calculated frequency f for the currently selected sample rate conversion ratio M is within the audio band (i.e., less than $f_{audio}$), then an audible component of spurious noise would be caused by sample rate converter 17 at this setting. Control passes back to decision 57, to determine if additional candidate ratio values M remain available. If so, the next candidate ratio M is selected and process 54 and decision 55 are repeated as before. Alternatively, of course, all of the candidate ratios M may be processed through process 54 and decisions 55, and those that do not cause AM interference can all be identified before the selection from among these possible ratios M is made. In this alternative approach, a NO result from decision 61 would result in selection of the next candidate ratio M that passed decisions 55a through 55c in this example.

If spurious noise will not be generated by sample rate converter 17 (decision 61 is NO), then the currently selected sample rate conversion ratio M is suitable for use at the current AM tuned frequency. This ratio M is then preferably stored in memory in association with the current AM tuned frequency; for example, this value of ratio M may be stored in SRC ratio memory 29 of controller 13, as shown in FIG. 3, either if calculated during system operation or calculated prior to manufacture.

The process of FIG. 6 may then be repeated, either for all possible AM tuned frequencies tunable by tuner 6 if performed before manufacture, or for each new AM tuned frequency encountered during operation if these calculations are performed on-board, during system operation.

In practice, according to the preferred embodiment of the invention, the set of sample rate conversion ratios M are restricted so that the tones that cause audible noise are avoided. Specifically, it has been discovered, in connection with this invention, that if the upsampling ratio N*M (i.e., the product of the oversampling multiple N and the sample rate conversion ratio M) is an integer, for example an integer in the set {6, 7, 8, 9, or 12}, the resulting aliasing tones generated in the resampling by sample rate converter 17 will be above the Nyquist frequency of the input signal. In other words, the application of this integer upsampling ratio N*M shifts the tone frequency by that integer value times the input sampling rate $f_s$ away from the baseband frequency.

It is contemplated that multiple sets of associated sample rate conversion ratios M may be provided within digital audio system 2, for example as stored in SRC ratio memory 29 as shown in FIG. 3. The particular set of associated ratios M that are to be enabled and used may be selected in the manufacture of digital audio system 2, for example by hardwiring certain otherwise unused external terminals of digital audio processor 10 into a pattern, or under software control (e.g., calling a particular sequence by way of a digital word written into a control register or the like). Digital audio system 2 is then ready for use, including as an AM radio receiver.

In operation, referring back to FIG. 1a in combination with FIG. 4, upon the user selecting a desired AM radio station by way of front panel controls 12, system microcontroller 14 interprets the desired carrier frequency $f_c$ for that AM station, and communicates, by way of digital control signals, the AM tuned frequency $f_c$ to tuner 6 and to PWM processor 10 in digital audio amplifier 8. As shown in FIG. 2, these digital control signals AM_TF are applied to controller 13 of PWM processor 10. In response to the selected AM tuned frequency, referring to FIG. 3, sample rate control logic 27 determines the associated sample rate conversion ratio M for that AM tuned frequency $f_c$, for example by interrogating SRC ratio memory 29 for a selected sequence of ratio values, and controls sample clock circuitry 25 to generate the appropriate clock signals including high-speed clock DCLK and the clock signals applied to sample rate converter 17 at the converted sampling rate (PWM frame rate) frequency $f_{SC}$.

Figure 5B:
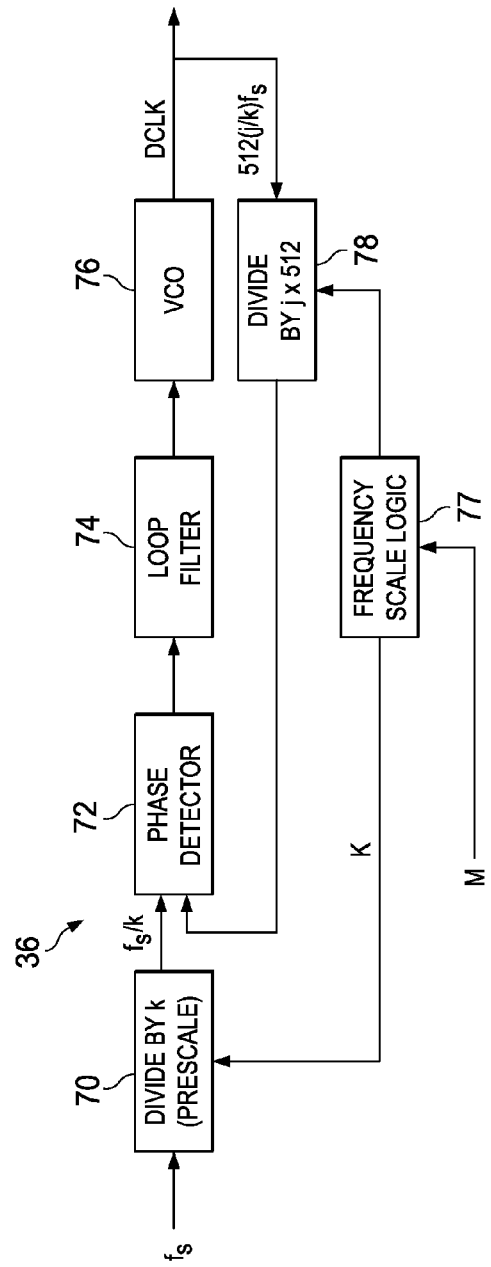
FIG. 5b is an electrical diagram, in block form, illustrating the construction of a digitally controlled analog phase-locked loop in the audio channel of the digital audio processor according to the preferred embodiment of the invention.

FIG. 5b illustrates the construction of APLL 36 in sample clock circuitry 13, by way of which the appropriate high speed clock DCLK, and precursor for the divided-down converted sampling rate (PWM frame rate) frequency $f_{SC}$, are generated according to the preferred embodiment of the invention. As typical for analog PLLs, APLL 36 includes prescale frequency divider 70, which receives the reference signal at sampling frequency $f_s$ in this example, and generates a divided-down clock signal at frequency $f_s/k$, where the integer k is the divisor of prescale frequency divider 70, generated by frequency scale logic 77 in response to the current value of sample rate conversion ratio M. This clock is applied to one input of phase detector 72, the other input of which receives a feedback signal from frequency divider 78. The output of phase detector 72 drives, via loop filter 74, voltage controlled oscillator 76. VCO 76 generates high-speed clock signal DCLK, which is also fed back to frequency divider 78. Frequency divider 78 divides down the frequency of clock signal DCLK by a factor of 512 times integer j; integer j is generated by frequency scale logic 77 in response to the current value of sample rate conversion ratio M. As a result, the frequency of high speed clock DCLK is 512 times the sampling frequency $f_s$, times the ratio j/k. Of course, the input reference clock to APLL 36 may be at a higher frequency, for example a reference frequency selected from a list of multiples of sampling frequency $f_s$ (e.g., $256f_s$, $512f_s$, $384f_s$, etc.), which will permit frequency divider 78 to divide down its input by a factor of j. For example, in such a case, if the input reference clock is at a frequency $512f_s$, the case of sample rate conversion ratio M=8/8 would be handled by j=64 and k=8, resulting in high speed clock DCLK of a frequency of $4096f_s$ (i.e., $64/8 \cdot 512 f_s$). Other combinations will be similarly derivable by those skilled in the art having reference to this specification.

According to the preferred embodiment of the invention, frequency scale logic 77 generates the integers j, k in response to the sample rate conversion ratio M communicated from controller 13. These integers j, k set the high speed clock DCLK frequency, and via frequency divider 38 (FIG. 4), the PWM frame rate frequency $f_{sc}$. Examples of the integers j, k and the resulting PWM frame rate frequency $f_{sc}$ and high-speed clock frequency $f_{DCLK}$, for selected ratios M and a sampling frequency $f_s$=44.1 kHz, according to the preferred embodiment of the invention, are:

|  | M = 5/8 | M = 6/8 | M = 7/8 | M = 8/8 | M = 9/8 | M = 12/8 |
|---|---|---|---|---|---|---|
| j | 60 | 72 | 56 | 64 | 72 | 72 |
| k | 12 | 12 | 8 | 8 | 8 | 6 |
| $f_{DCLK}$ | 113 MHz | 136 MHz | 158 MHz | 181 MHz | 203 MHz | 271 MHz |
| $f_{SC}$ | 221 kHz | 265 kHz | 309 kHz | 353 kHz | 397 kHz | 529 kHz |

These frequencies, in addition to being generated in a simple and elegant manner, are selectable as described above relative to FIG. 6 in order to avoid causing significant AM interference.

Figure 8:
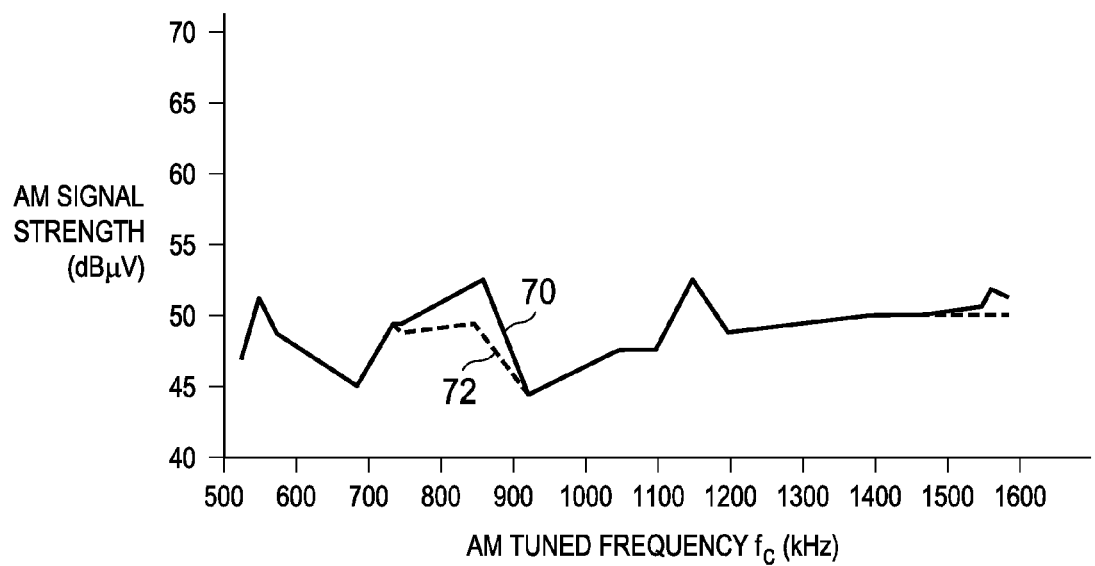
FIG. 8 is a plot of AM signal strength illustrating the effect of the AM interference accomplished according to the preferred embodiment of the invention.

In FIG. 8, plots of AM tuner sensitivity performance illustrate an example of improved AM tuner performance provided by the preferred embodiment of the invention. Plot 70 illustrates the AM signal strength as a function of AM tuned frequency $f_c$, in which sample rate converter 17 is operated according to the preferred embodiment of the invention, using an example of an sequence of sample rate conversion ratios M generated according to the process of FIG. 6. Plot 72, on the other hand, illustrates the AM signal strength with no sample rate conversion applied. As evident from a comparison of plots 70, 72, this embodiment of the invention is able to greatly improve the AM signal strength around the AM tuned frequencies $f_c$ between about 750 kHz and 925 kHz, and also at frequencies above about 1450 kHz; in this example, the uncorrected PWM frame rate (i.e., a PWM frame rate of $Nf_s$) causes significant interference at these frequencies. According to the preferred embodiment of the invention, therefore, substantial improvement in the AM sensitivity and fidelity is provided, in a very efficient manner. As described above, selection of the appropriate sample rate conversion ratio M to avoid AM interference, and to also avoid audible noise from sample rate converter 17 itself, is effected simply by changing the prescale and feedback divider integers j, k; these multipliers are preferably precalculated, so that they can be generated by simple logic as described above relative to FIG. 6.

This invention may also be used to account for changes in the sampling frequency $f_s$, such as can occur when a different audio source is utilized. Referring back to FIG. 1a, DVD audio may be provided at a lower sampling rate $f_s$, for example 32 kHz. While no AM tuning is performed to amplify this audio signal, and thus AM interference from the PWM frame rate is not an issue, the use of this lower sampling rate $f_s$ may cause some functions, such as noise shaping filter function 19 (FIG. 3) to operate at too low a frequency, resulting in noise in the upper portion of the audio band. In this example, therefore, sample rate converter 17 can be controlled, responsive to the selection of the audio source (or in response to the digital audio sampling rate $f_s$), to re-sample the output of interpolation filter 16 to increase the PWM frame rate at PWM conversion function 21.

In operation, by way of example, system microcontroller 14 would receive user inputs, from front panel controls 12, indicating that DVD loader 7 is the source of audio signals. These audio signals are applied to MPEG decoder 9. System microcontroller 14 enables MPEG decoder 9 to generate digital audio signals on lines DIG_AUD, at a sampling rate $f_s$ of 32 kHz, in response to the audio signals retrieved by DVD loader. PWM processor 10 receives these digital audio signals, similarly as in the case of audio signals from tuner 6 described above.

However, system microcontroller 14 also indicates, to PWM processor 10, that the sampling rate $f_s$ of the digital audio from MPEG decoder 9 is at the lower rate, e.g., 32 kHz, and that sample rate converter 17 is to apply a sample rate conversion ratio M that upsamples the interpolated datastream by a precalculated multiple. For example, a preferred ratio M in an exemplary implementation of this embodiment of the invention is 1.5, or with reference to the above description, M=12/8. This ratio M can be selected, in a manner similar as processes 60 through 62 (FIG. 6) to ensure that sample rate converter 17 itself does not generate audible noise; as a result, no additional filtering or other complex processing is required to effect the sample rate conversion according to this embodiment of the invention.

Referring to the example of FIG. 5b, this ratio M would be effected by frequency scale logic 77 receiving the value M=12/8, and applying integer j at a value of 72 to feedback frequency divider 78, and integer k at a value of 6 to prescale frequency divider 70. This would result in a high-speed clock signal DCLK at a frequency of about 197 MHz, and a converted sampling frequency (and PWM frame rate) $f_{sc}$ of 384 kHz. Without the application of sample rate converter 17 at this higher ratio M according to this embodiment of the invention, the PWM frame rate would simply be the sampling frequency $f_s$ of 32 kHz times the interpolation multiple N=8, or 256 kHz, which has been observed to result in noise in the upper portion of the audio band as a result of noise shaping function 19.

According to the preferred embodiments of the invention, therefore, the PWM frame rate in a digital audio system can be easily adjusted, for example in response to the AM tuned frequency of an AM tuner in the system, or in response to a change in the digital input audio sampling rate. This adjustment in the PWM frame rate results in improved audio output fidelity, for example by avoiding the generation of AM interference, or by ensuring adequate sample rates so that digital audio processing does not itself generate audible noise. According to a preferred embodiment of the invention, the adjustment of the sample rate conversion is effected by relatively simple logic, for example which controls an analog PLL, in response to a preselected pattern of sample rate conversion ratios that are calculated for various AM tuned frequencies, or for expected input audio sampling frequencies. The determination and implementation of the sample rate conversion is therefore extremely efficient, and can be carried out in effectively a transparent manner insofar as the system user is concerned, and can be implemented at very low cost.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A digital audio receiver, comprising:
an AM tuner for demodulating an amplitude-modulated signal, at a selected AM tuned frequency, into a baseband audio signal; and
a digital audio amplifier, coupled to the AM tuner, and comprising:
an interpolation filter, for receiving an input datastream corresponding to the baseband audio signal at a first sampling frequency, and for oversampling the input datastream by a multiple;
a sample rate converter, receiving the oversampled datastream and for producing a converted datastream at a converted sampling frequency;
pulse-width-modulation (PWM) circuitry, for generating, at a PWM frame rate, pulse-width-modulated signals corresponding to the converted datastream; and
clock circuitry for generating clock signals to the sample rate converter and to the pulse-width-modulation circuitry to select the converted sampling frequency responsive to the AM tuned frequency.

2. The receiver of claim 1, wherein the clock circuitry generates a clock signal at the converted sampling frequency to the sample rate converter, and generates a high-speed clock signal at a multiple of the converted sampling frequency to the pulse-width-modulation circuitry.

3. The receiver of claim 2, wherein the digital audio amplifier further comprises:
control circuitry, for receiving a signal indicating the AM tuned frequency, and for selecting a sample rate converter ratio responsive to the AM tuned frequency.

4. The receiver of claim 3, wherein the clock circuitry comprises:
a phase-locked loop for generating an output clock signal responsive to a reference periodic signal, and comprising at least one frequency divider for controlling the frequency of the output clock signal relative to the reference periodic signal and responsive to the sample rate converter ratio.

5. The receiver of claim 4, wherein the clock circuitry further comprises:
logic circuitry for communicating at least one frequency divide integer to at least one frequency divider in the phase-locked loop, responsive to the sample rate converter ratio.

6. The receiver of claim 5, wherein the phase-locked loop generates the high-speed clock signal as the output clock signal;
and wherein the clock circuitry further comprises:
a frequency divider, having an input receiving the high-speed clock signal, for generating the clock signal at the converted sampling frequency.

7. The receiver of claim 3, wherein the sample rate converter ratio is associated with the AM tuned frequency in such a manner that the PWM frame rate fundamental frequency and at least one harmonic differ from the AM tuned frequency by at least an interference bandwidth.

8. The receiver of claim 3, wherein the AM tuner comprises at least first and second demodulation stages, the first demodulation stage for demodulating the amplitude-modulated signal to an intermediate frequency;
and wherein the sample rate converter ratio is selected so that the PWM frame rate fundamental frequency and at least one harmonic differ from the intermediate frequency by at least an interference bandwidth.

9. The receiver of claim 8, wherein the sample rate converter ratio is selected so that the PWM frame rate fundamental frequency and at least one harmonic differ from an image frequency corresponding to a difference between the AM tuned frequency and the intermediate frequency, by at least an interference bandwidth.

10. The receiver of claim 3, further comprising:
a second audio source, for generating a digital audio signal at a second sampling frequency; and
a controller for selecting among a plurality of audio sources comprising the AM tuner and the second audio source, and for communicating the selected audio source to the digital audio amplifier;
wherein the control circuitry of the digital audio amplifier, responsive to receiving a signal from the controller indicating selection of the second audio source, selects a selected sample rate converter ratio.

11. The receiver of claim 10, wherein the controller is also for communicating the AM tuned frequency to the control circuitry of the digital audio amplifier.

12. The receiver of claim 3, further comprising:
a controller for communicating the AM tuned frequency to the control circuitry of the digital audio amplifier;
wherein the control circuitry further comprises a memory for storing a plurality of sample rate converter ratio values, each associated with at least one of a plurality of AM tuned frequency values.

13. A method of processing audio signals, comprising:
tuning an AM tuner to an AM tuned frequency;
associating a sample rate converter ratio with the AM tuned frequency, so that each of a PWM frame rate, corresponding to the sample rate converter ratio, and at least one harmonic of the PWM frame rate differ from the AM tuned frequency by at least an interference bandwidth;
demodulating an amplitude-modulated signal received at the AM tuned frequency;
generating a digital datastream from the demodulated amplitude-modulated signal, the digital datastream at a first sampling frequency;
upsampling the digital datastream by an upsampling multiple to produce an upsampled datastream at a multiple of the first sampling frequency;
converting the upsampled datastream to a converted sampling frequency responsive to the associated sample rate converter ratio; and
pulse-width-modulating the converted datastream at the PWM frame rate corresponding to the sample rate converter ratio.

14. The method of claim 13, wherein the converting step comprises:
resampling the upsampled datastream at the converted sampling frequency.

15. The method of claim 14, wherein the PWM frame rate equals the converted sampling frequency.

16. The method of claim 13, wherein the associating step comprises:
sample rate converter ratio with the AM tuned frequency, so that each of a
selecting a candidate sample rate converter ratio;

calculating a PWM frame rate corresponding to the candidate sample rate converter ratio and the first sampling frequency;
responsive to the calculated PWM frame rate and at least one harmonic of the calculated PWM frame rate differing from the AM tuned frequency by at least an interference bandwidth, storing the candidate sample rate converter ratio in association with the AM tuned frequency.

17. The method of claim 16, wherein the associating step further comprises:
calculating a difference frequency between the multiple of the first sampling frequency and the calculated PWM frame rate;
and wherein the storing step is performed responsive to both the calculated PWM frame rate and at least one harmonic of the calculated PWM frame rate differing from the AM tuned frequency by at least an interference bandwidth and responsive to the difference frequency exceeding an upper audio frequency limit.

18. The method of claim 16, wherein the demodulating step comprises:
demodulating the amplitude-modulated signal to an intermediate frequency;
and wherein the storing step is performed responsive to both the calculated PWM frame rate and at least one harmonic of the calculated PWM frame rate differing from the AM tuned frequency by at least a first interference bandwidth, and responsive to the calculated PWM frame rate and at least one harmonic of the calculated PWM frame rate differing from the intermediate frequency by at least a second interference bandwidth.

19. The method of claim 13, further comprising:
generating a digital audio signal at a second sampling frequency from a second audio source;
upsampling the digital audio signal by an upsampling multiple to produce an upsampled digital audio signal at a multiple of the second sampling frequency;
converting the upsampled datastream to a converted sampling frequency responsive to a sample rate converter ratio associated with the second sampling frequency; and
converting the converted datastream to a pulse-width-modulated output signal at a PWM frame rate corresponding to the sample rate converter ratio associated with the second sampling frequency.

* * * * *